United States Patent
Nagel et al.

(10) Patent No.: US 8,877,522 B2
(45) Date of Patent: Nov. 4, 2014

(54) METHOD OF MANUFACTURING A MAGNETORESISTIVE-BASED DEVICE WITH VIA INTEGRATION

(71) Applicant: EverSpin Technologies, Inc., Chandler, AZ (US)

(72) Inventors: Kerry Nagel, Scottsdale, AZ (US); Sarin Deshpande, Chandler, AZ (US); Moazzem Hossain, Chandler, AZ (US); Sanjeev Aggarwal, Scottsdale, AZ (US)

(73) Assignee: EverSpin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/283,413

(22) Filed: May 21, 2014

(65) Prior Publication Data
US 2014/0287536 A1 Sep. 25, 2014

Related U.S. Application Data

(62) Division of application No. 13/801,419, filed on Mar. 13, 2013.

(51) Int. Cl.
*H01L 21/00* (2006.01)
*G11C 11/00* (2006.01)
*H01L 43/12* (2006.01)
*H01L 21/768* (2006.01)
*H01L 27/22* (2006.01)

(52) U.S. Cl.
CPC .......... *H01L 43/12* (2013.01); *H01L 21/76898* (2013.01); *H01L 27/222* (2013.01)
USPC ................................................ 438/3; 365/158

(58) Field of Classification Search
None
See application file for complete search history.

(56) References Cited

U.S. PATENT DOCUMENTS

| | | | |
|---|---|---|---|
| 7,358,100 B2 * | 4/2008 | Cao et al. | 438/3 |
| 7,601,548 B2 * | 10/2009 | Kim | 438/3 |
| 7,973,376 B2 * | 7/2011 | Furuta et al. | 257/421 |
| 2002/0196654 A1 * | 12/2002 | Mitarai et al. | 365/145 |
| 2008/0185670 A1 * | 8/2008 | Kajiyama | 257/421 |
| 2011/0233696 A1 * | 9/2011 | Li | 257/421 |

\* cited by examiner

Primary Examiner — Andres Munoz
(74) Attorney, Agent, or Firm — Ingrassia Fisher & Lorenz, P.C.

(57) ABSTRACT

A method is provided for forming a first via with an electrically conductive material, for example, copper, that is formed over and coupled to a conductive landing pad of an MRAM array. A sputter step is performed to lower the surface of the first via below that of a surrounding dielectric material. This recess is repeated in subsequent processing steps, providing alignment marks for the formation of a magnetic tunnel junction. The magnetic tunnel junction may be offset from the first via, and a second via being formed above the magnetic tunnel junction and to a conductive layer.

20 Claims, 4 Drawing Sheets

METHOD OF MANUFACTURING A MAGNETORESISTIVE-BASED DEVICE WITH VIA INTEGRATION

This application claims the benefit of U.S. Provisional Application No. 61/716,919 filed 22 Oct. 2012 and U.S. Non-Provisional application Ser. No. 13/801,419 filed Mar. 13, 2013.

TECHNICAL FIELD

The exemplary embodiments described herein relate generally to a method of manufacturing magnetoresistive-based devices and more particularly to a method of integrating vias within a magnetoresistive-based device.

BACKGROUND

Magnetoresistive-based devices, spin electronic devices, and spintronic devices are synonymous terms for devices that make use of effects predominantly caused by electron spin. Magnetoresistive-based devices are used in numerous information devices to provide non-volatile, reliable, radiation resistant, and high-density data storage and retrieval. The numerous Magnetoresistive-based devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. The memory elements are programmed by the magnetic field created from current-carrying conductors. Typically, two current-carrying conductors, the "digit line" and the "bit line", are arranged in cross point matrix for programming of the memory element.

The interconnect stack is formed utilizing a number of vias and metallization layers. The via that electrically couples the interconnect stack to the memory element often is referred to as the MVia. Present day methods for forming MVias in an MRAM device often produce undesirable results and challenges. For example, the interconnect stack, including the MVia, is coupled to a digit line landing pad, which typically is formed at the same time the digit line is formed. However, known processes cause the MVia resistance to be high relative to the tunnel junction resistance. Note that the resistance is critical to the overall resistance of the device, of which only the resistance across the tunnel barrier is desirable. Other resistances in series detract from the raw MR of the device. With a filled via, the resistance can be low, if the filling material is very conductive, e.g., Cu. Another advantage is to improve the step coverage of the MTJ material in the via. However, a filled and polished layer, topped off with the bottom electrode, cannot be aligned to because the top layer is both opaque and completely planar.

Accordingly, there is a need for integrating vias within a magnetoresistive-based device which reduces series resistance, improve robustness to dielectric breakdown, allows alignment marks to be visible for subsequent processing, and provides placement of the bit line displaced from veils of the bottom electrode veils. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

The location of a magnetic tunnel junction on a conductive layer is determined by a recess transferred through successive layers from a sputtered conductive via.

In an exemplary embodiment, a method of manufacturing a magnetic tunnel junction includes forming a metal filled first via in a first insulating material; performing a sputter of the via and the first insulating material at different rates to form a recess comprising a first surface of the first via out of plane with a second surface of the first insulating material; patterning a first conductive layer on the first via and first insulating material; forming a magnetic tunnel junction layer on the first conductive layer; forming a second conductive layer on the magnetic tunnel junction layer, wherein the recess is duplicated in each of the first conductive layer, the magnetic tunnel junction layer, and the second conductive layer; patterning the second conductive layer and the magnetic tunnel junction layer to form a conductive electrode overlying a magnetic tunnel junction, the position of the conductive electrode and the magnetic tunnel junction determined by aligning the patterning with the recess.

In another exemplary embodiment, a method of manufacturing a magnetic tunnel junction includes forming a metal filled first via in a first insulating material; performing a sputter of the first via and the first insulating material at different rates to form a first surface of the first via out of plane with a second surface of the first insulating material; patterning a first conductive layer on the first via and the first insulating material to form a third surface of the first conductive layer above the first surface and out of plane with a fourth surface of the first conductive layer; and forming the magnetic tunnel junction on the first conductive layer at a location based on the location of the third surface.

In yet another exemplary embodiment, a method of manufacturing a magnetic tunnel junction includes forming a first conductive via within a first dielectric material layer and in electrical contact with a conductive landing pad of a memory array; performing a sputter process to form a first recess in the first conductive via below that of a surface of the first dielectric material layer; forming a first conductive layer on the conductive via and the surface of the first dielectric material layer, the first conductive layer defining a second recess below that of a surface of the first conductive layer and above the first recess; forming a magnetic tunnel junction tunnel junction layer on the conductive layer, the magnetic tunnel junction tunnel junction layer defining a third recess below that of a surface of the magnetic tunnel junction tunnel junction layer and above the second recess; forming a second conductive layer on the magnetic tunnel junction tunnel junction layer, the second conductive layer defining a fourth recess below that of a surface of the second conductive layer and above the third recess aligning a pattern on the fourth recess; and patterning an electrode overlying a magnetic tunnel junction from the second conductive layer and the magnetic tunnel junction layer.

BRIEF DESCRIPTION OF THE DRAWINGS

The present invention will hereinafter be described in conjunction with the following drawing figures, wherein like numerals denote like elements.

DETAILED DESCRIPTION

Figure 1:
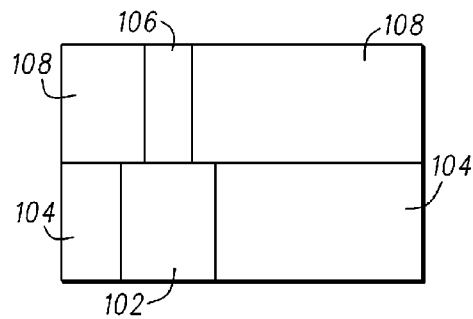
FIGS. 1-7 are partial cross sectional schematics of a process of forming conductive vias in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

During the course of this description, like numbers are used to identify like elements according to the different figures that illustrate the various exemplary embodiments.

For simplicity and clarity of illustration, the drawing figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During fabrication of an MRAM array architecture, each succeeding layer is formed, for example, deposited or sputtered, in sequence and each MTJ device may be defined by selective deposition, photolithography processing, etching, etc. using any of the techniques known in the semiconductor industry. Typically the layers of the MTJ are formed by thin-film deposition techniques such as physical vapor deposition, including magnetron sputtering and ion beam deposition, or thermal evaporation.

The embodiments described herein include filling a via (typically referred to as an MVia) with an electrically conductive material, for example, copper, that is formed over and coupled to a digit line (landing pad) of an MRAM array. A sputter step is performed to lower the surface of the MVia below that of a surrounding dielectric material. An electrically conductive layer is deposited over the MVia and the dielectric material, leaving a recess in the top surface of the MVia above the MVia. The MTJ is deposited above the electrically conductive layer, and the recess is repeated. A top electrode may be deposited above the MTJ, and the recess is repeated. The recess provides for an acceptable alignment mark for the MTJ bit photo layer step. A memory cell (or MTJ bit) may then be formed on the conductive layer, spaced from the MVia. Another via (typically referred to as a TJVia) is optionally formed over the memory cell for coupling to a bit line.

Referring to FIG. 1, a landing pad 102 (or digit line of the MRAM array) is formed in a dielectric material 104 in a manner well known in the semiconductor industry. The landing pad is a conductive material coupled to a transistor (not shown). Another layer of dielectric material 108 is deposited over the digit line 102 and the dielectric material 104. In one exemplary embodiment, the dielectric material 108 is a non-conducting material, for example, silicon oxide with a silicon nitride etch stop layer, and has a thickness range generally of 1000-9000 Angstroms, and more preferably in a range of 1500-6000 Angstroms. A via 106 is formed within the dielectric material 108 and overlying the landing pad 102, and is filled with copper, preferably, but may be any conductive material used in semiconductor processes. The via 106 has a diameter in the range of 45-250 nm.

It should be noted that all components of this exemplary embodiment as illustrated in subsequent figures that are similar to components of the exemplary embodiment of FIG. 1 are designated with like numbers.

Figure 2:
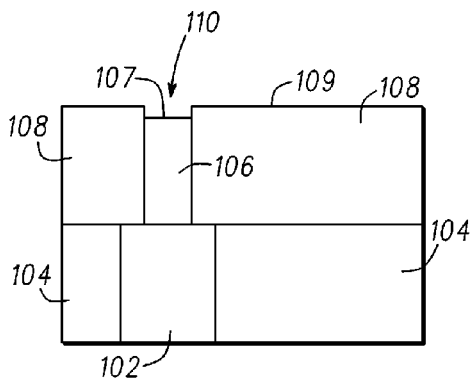

A sputter step is performed (FIG. 2) to create a recess 110 in the top surface 107 of the conductive via 106. The recess preferably has a depth in the range of 100-400 Angstroms and is formed with a differential sputter rate between the conductive via material and the surrounding material.

Figure 3:
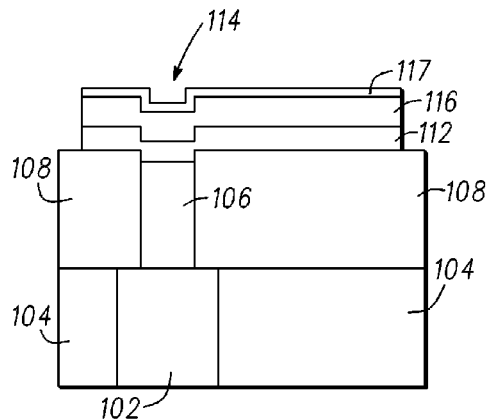
Figure 4:
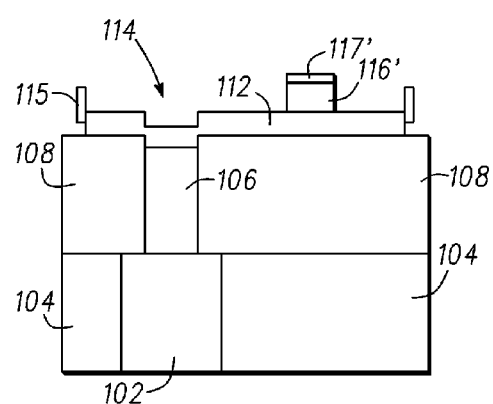

A conductive layer 112 is deposited (FIG. 3) over the dielectric material 108 and the filled via 106, leaving a recess 114 (or an out of plane surface), having about the same dimensions as the recess 110, in the surface of the conductive layer 112 above the recess 110. The conductive layer preferably has a thickness in the range of 100-1250 Angstroms, but preferably has a thickness of 200-750 Angstroms. A MTJ bit 116 layer and a conductive layer 117 are formed on the conductive layer 112, wherein a recess 114 is defined having about the same dimensions as the recess 114. It is this recess 114 that allows for alignment in the patterning (FIG. 4) of the MTJ bit 116' and conductive electrode 117', which in this embodiment, is spaced from the MVia 102. Note that veils 115 are typically formed in the etching of the conductive layer 112. The advantage the embodiments described herein with regard to these veils 115 is subsequently discussed.

The MTJ bit 116' typically has a structure that includes multiple magnetic layers (not shown) separated by various non-magnetic layers (not shown), such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field-switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The spin angular momentum carried by the spin-polarized tunneling current causes reversal of the free layer, with the final state (parallel or antiparallel) determined by the polarity of the current pulse. The memory elements are programmed by the magnetic field created from current-carrying conductors.

Figure 5:
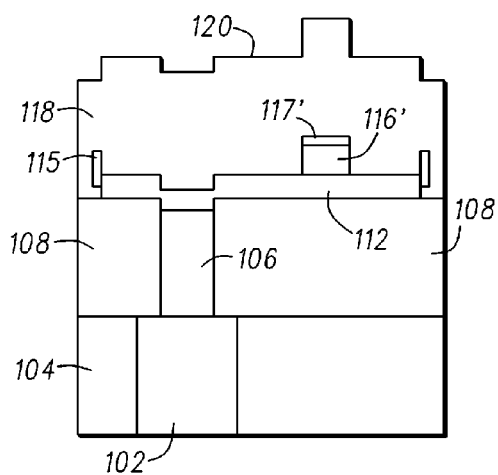

A dielectric material layer 118 is deposited (FIG. 5) over the conductive layer 112, MTJ bit 116', leaving an uneven surface 120 that is then polished (FIG. 6) resulting in a smooth surface 122. The thickness of the dielectric material layer 118 preferably has a thickness in the range of 1000-10000 Angstroms, but preferably has a thickness of 2000-7000 Angstroms. A conductive via 124 (referred to herein as the TJVia) is then formed (FIG. 7) in the dielectric material 118, and a conductive line 126 (or bit line of the MRAM array) is deposited (FIG. 8) over the dielectric material 118, and over and in electrical contact with the TJVia 124. The conductive via 124 is filled with copper, preferably, but may be any conductive material used in semiconductor processes. The via is allowed to be significantly larger than the bit it is making contact to, but has a minimum size of 45 nm, depending on technology node.

Figure 6:
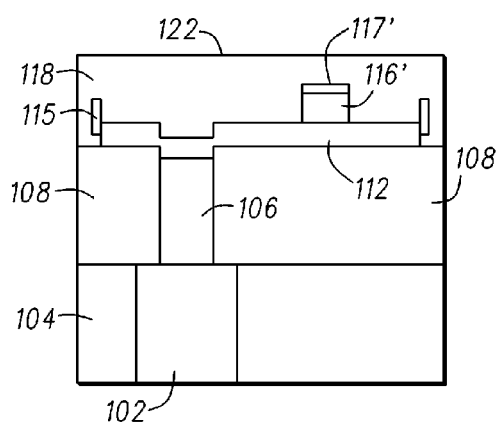
Figure 7:
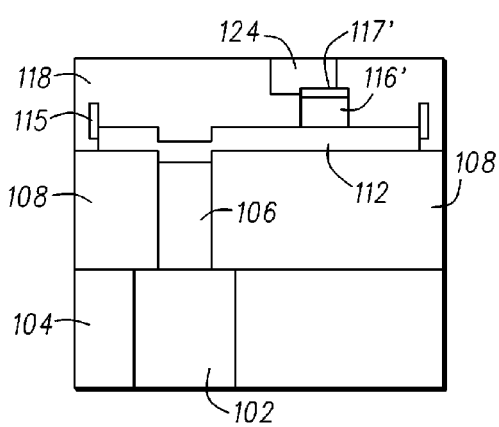
Figure 8:
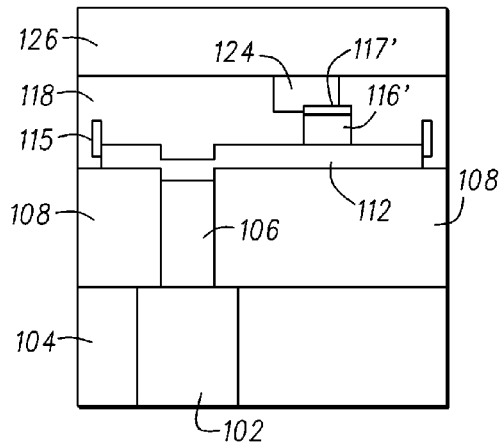

It is possible to contact the top of the top electrode 117' with a bit line using an oxide polish step without explicitly patterning a via over the bit. As shown in FIG. 6, making contact to the top of the top electrode 117' runs the risk of making contact to the veils 115, which is undesirable as this contact would cause a short across the tunnel barrier of the MTJ bit 116'. As shown in FIG. 7, providing a conductive via 124 allows positioning the conductive line 126 sufficiently far enough above the veils 115 so as to avoid any risk of making contact to them. Using a highly conductive material, such as Cu, and filling the via 124, provides a low resistance path which serves to reduce any negative impact to the MR (as described for the filled Cu via 106). The via 124 is shown as potentially larger than and offset to the MTJ bit 116', as the MTJ bit 116' may be scaled to a smaller geometry than is possible for the via at a particular technology node (spin torque scaling is advantageous in that current required for switching drops as bit size shrinks). Offsetting the via 124 provides maximum separation from the veils 115 in both the X and Y directions.

Figure 9:
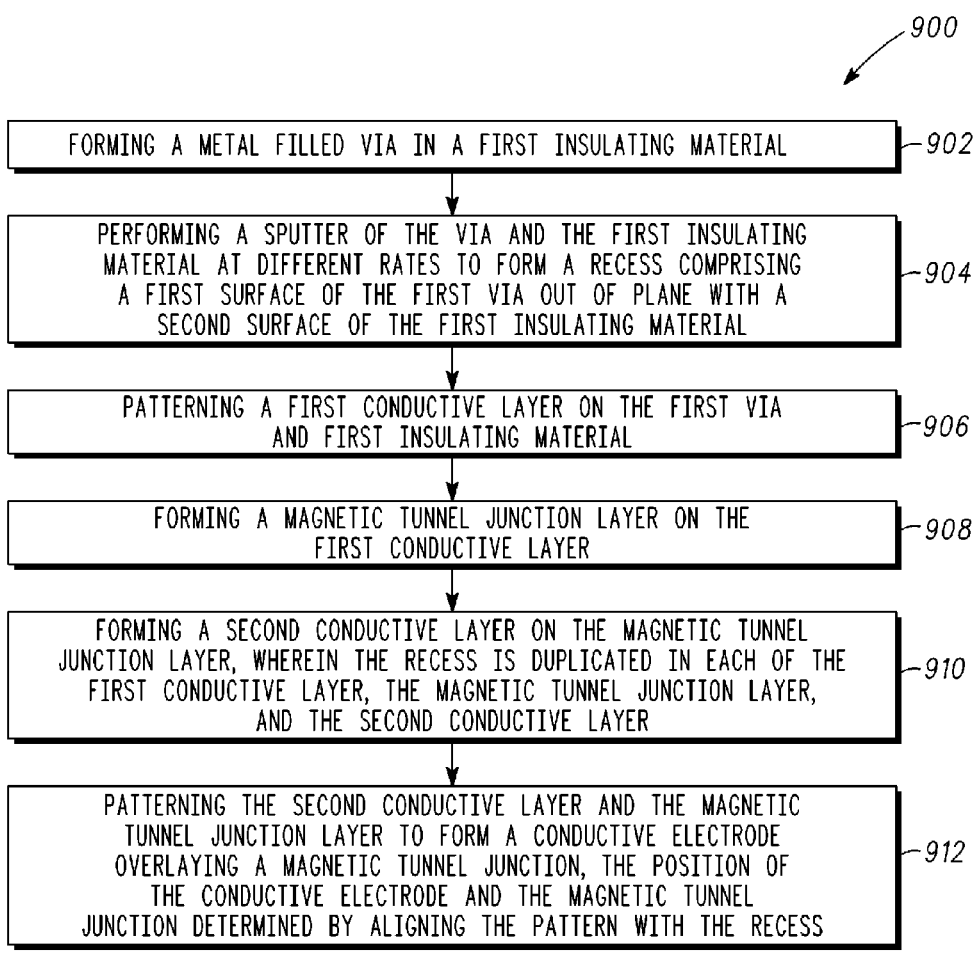
FIG. 9 is a flow chart of the process in accordance with an exemplary embodiment.
Figure 10:
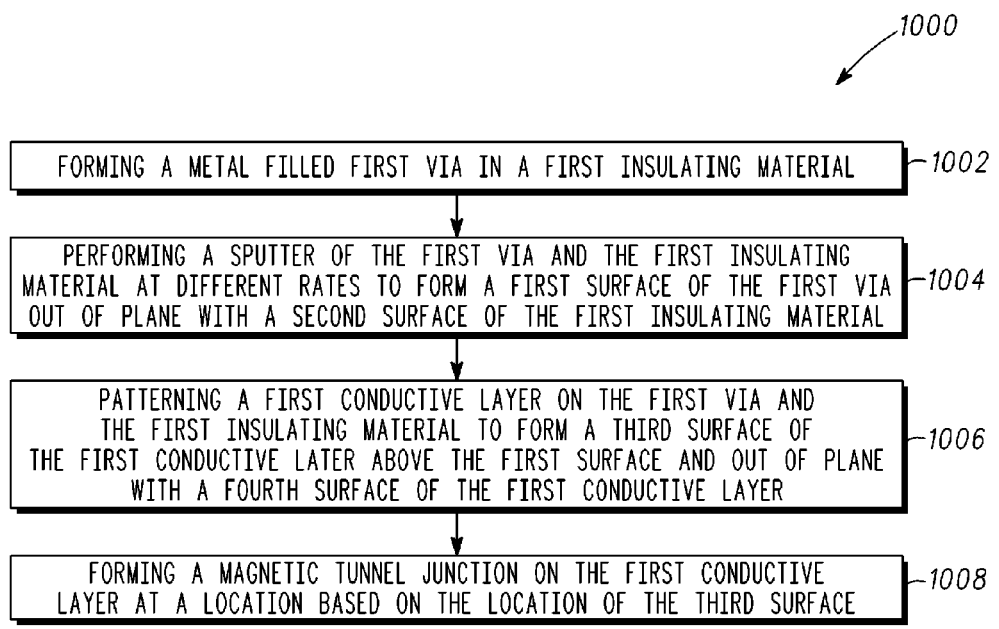
FIG. 10 is a flow chart of the process in accordance with another exemplary embodiment.
Figure 11:
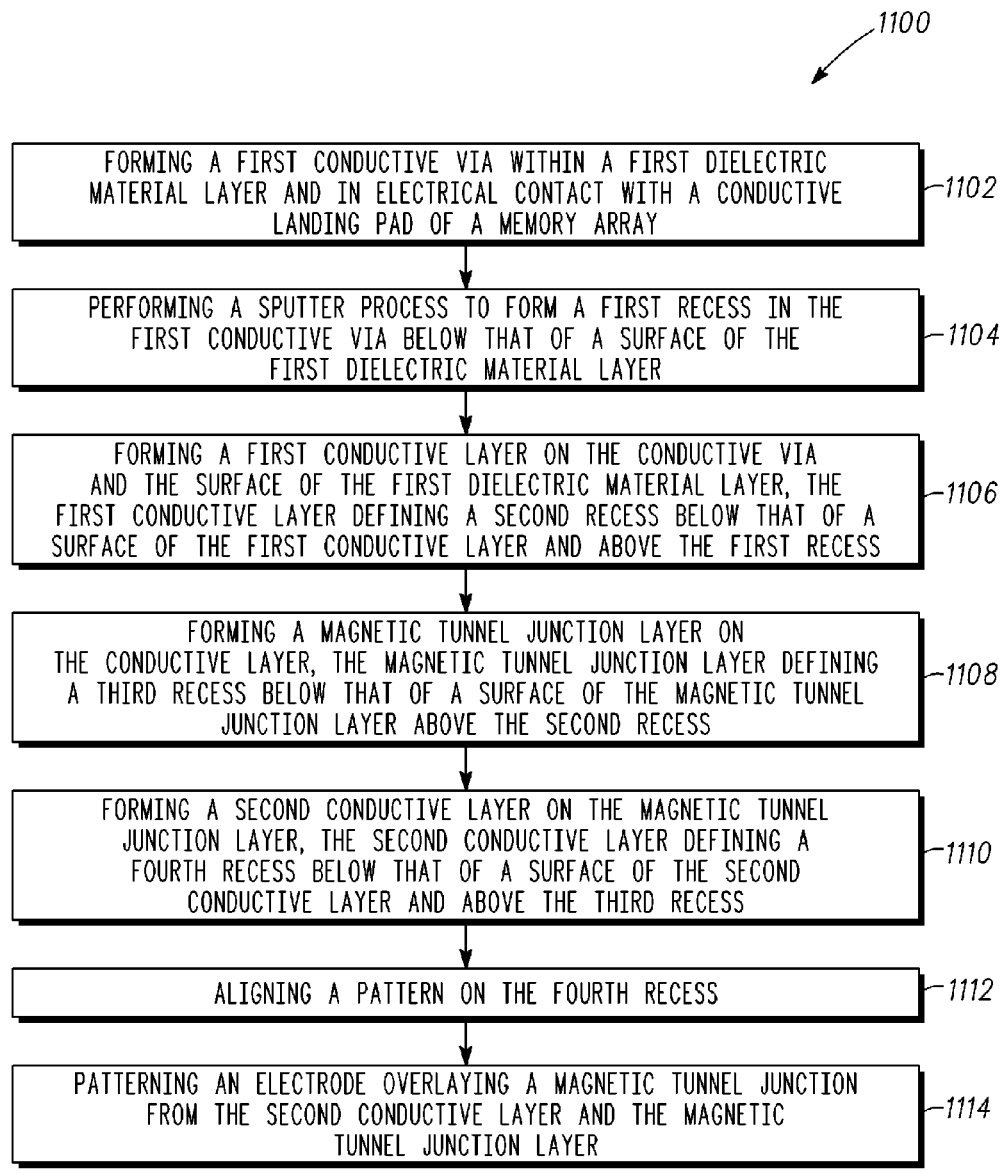
FIG. 11 is a flow chart of the process in accordance with yet another exemplary embodiment.

FIGS. 9, 10, and 11 are flow charts that illustrate exemplary embodiments of methods 900, 1000, and 1100 of forming vias within an MRAM array. For illustrative purposes, the following description of methods 900 and 1000 may refer to elements mentioned above in connection with FIGS. 1-7. It should be appreciated that methods 900, 1000, and 1100 may include any number of additional or alternative tasks, the tasks shown in FIGS. 9, 10, and 11 need not be performed in the illustrated order, and methods 900, 1000, and 1100 may be incorporated into a more comprehensive procedure or process having additional functionality not described in detail herein. Moreover, one or more of the tasks shown in FIGS. 9, 10, and 11 could be omitted from an embodiment of the methods 900, 1000, and 1100 as long as the intended overall functionality remains intact.

The method of FIG. 9 includes forming 902 a metal filled first via in a first insulating material; performing 904 a sputter of the via and the first insulating material at different rates to form a recess comprising a first surface of the first via out of plane with a second surface of the first insulating material; patterning 906 a first conductive layer on the first via and first insulating material; forming 908 a magnetic tunnel junction layer on the first conductive layer; forming 910 a second conductive layer on the magnetic tunnel junction layer, wherein the recess is duplicated in each of the first conductive layer, the magnetic tunnel junction layer, and the second conductive layer; and patterning 912 the second conductive layer and the magnetic tunnel junction layer to form a conductive electrode overlying a magnetic tunnel junction, the position of the conductive electrode and the magnetic tunnel junction determined by aligning the patterning with the recess.

Referring to FIG. 10, the method of manufacturing a magnetic tunnel junction, includes forming 1002 a metal filled first via in a first insulating material; performing 1004 a sputter of the first via and the first insulating material at different rates to form a first surface of the first via out of plane with a second surface of the first insulating material; patterning 1006 a first conductive layer on the first via and the first insulating material to form a third surface of the first conductive layer above the first surface and out of plane with a fourth surface of the first conductive layer; and forming 1008 the magnetic tunnel junction on the first conductive layer at a location based on the location of the third surface.

Referring to FIG. 11, the method includes a method of manufacturing a magnetic tunnel junction, including forming 1102 a first conductive via within a first dielectric material layer and in electrical contact with a conductive landing pad of a memory array; performing 1104 a sputter process to form a first recess in the first conductive via below that of a surface of the first dielectric material layer; forming 1106 a first conductive layer on the conductive via and the surface of the first dielectric material layer, the first conductive layer defining a second recess below that of a surface of the first conductive layer and above the first recess; forming 1108 a magnetic tunnel junction tunnel junction layer on the conductive layer, the magnetic tunnel junction tunnel junction layer defining a third recess below that of a surface of the magnetic tunnel junction tunnel junction layer and above the second recess; forming 1110 a second conductive layer on the magnetic tunnel junction tunnel junction layer, the second conductive layer defining a fourth recess below that of a surface of the second conductive layer and above the third recess aligning 1112 a pattern on the fourth recess; and patterning 1114 an electrode overlying a magnetic tunnel junction from the second conductive layer and the magnetic tunnel junction tunnel junction layer.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values.

Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of forming a magnetoresistive-based device, comprising:
    forming a first via that includes an electrically conductive material, the electrically conductive material in the first via having an upper surface that is below an upper surface of a layer of dielectric material within which the first via is formed;
    depositing a first layer of electrically conductive material over the first via and the layer of dielectric material, wherein depositing the first layer of electrically conductive material results in a recess in the first layer of electrically conductive material overlying the first via, wherein a first portion of the first layer of electrically conductive material contacts the upper surface of the electrically conductive material in the first via, wherein the first portion of the first layer of electrically conductive material is below the upper surface of the layer of dielectric material;
    forming a magnetoresistive element over the first layer of electrically conductive material, the magnetoresistive element including a plurality of magnetic layers and a tunnel junction, wherein forming the magnetoresistive element includes positioning the magnetoresistive element relative to the first via based in part on the recess in the first layer of electrically conductive material;
    forming an electrode over the magnetoresistive element; and
    forming a second via over the electrode.

2. The method of claim 1, wherein forming the first via includes:
    filling the first via with the electrically conductive material, and
    sputtering to lower the upper surface of the electrically conductive material in the first via.

3. The method of claim 1, wherein the electrically conductive material in the first via is a metal.

4. The method of claim 3, wherein the electrically conductive material in the first via is copper.

5. The method of claim 1, wherein forming the magnetoresistive element and the electrode further comprises:
    depositing a plurality of layers corresponding to the magnetoresistive element;
    depositing a second layer of electrically conductive material over the plurality of layers corresponding to the magnetoresistive element;
    patterning the second layer of electrically conductive material to form the electrode, and
    patterning the plurality of layers corresponding to the magnetoresistive element to form the magnetoresistive element.

6. The method of claim 5, wherein the recess in the first layer of electrically conductive material is repeated in the plurality of layers corresponding to the magnetoresistive element as a recess in the plurality of layers corresponding to the magnetoresistive element, wherein the recess in the plurality of layers corresponding to the magnetoresistive element is repeated in the second layer of electrically conductive layer as a recess in the second layer of electrically conductive material, and wherein patterning the second layer of electrically conductive material and the patterning the plurality of layers corresponding to the magnetoresistive element is based at least in part on the recess in the second layer of electrically conductive material.

7. The method of claim 6, wherein forming the magnetoresistive element and forming the electrode further comprises forming the magnetoresistive element and forming the electrode such that the magnetoresistive element and the electrode are offset from the first via, wherein the offset is determined based at least in part on the recess in the second layer of electrically conductive material.

8. The method of claim 1, wherein positioning the magnetoresistive element relative to the first via includes positioning the magnetoresistive element offset from the first via.

9. The method of claim 1 wherein forming the second via over the electrode further includes offsetting, in at least one direction, the second via with respect to the magnetoresistive element.

10. The method of claim 1, wherein forming the magnetoresistive element further comprises forming a magnetic tunnel junction memory cell that includes a fixed magnetic layer and a free magnetic layer.

11. The method of claim 10, wherein the magnetic tunnel junction memory cell is included in a spin-torque magnetic random access memory.

12. The method of claim 1, further comprising etching the first layer of electrically conductive material after forming the magnetoresistive element and the electrode.

13. A method of forming a magnetoresistive based device, comprising:
    filling a first via with an electrically conductive material, the first via formed in a layer of dielectric material;
    sputtering to lower an upper surface of the electrically conductive material in the first via such that the upper surface of the electrically conductive material in the first via is below an upper surface of the layer of dielectric material within which the first via is formed;
    depositing a first layer of electrically conductive material over the first via and the layer of dielectric material, wherein a first portion of the first layer of electrically conductive material contacts the upper surface of the electrically conductive material in the first via, and wherein the first portion of the first layer of electrically conductive material is below the upper surface of the layer of dielectric material;

depositing a plurality of layers corresponding to a magnetoresistive element;

depositing a second layer of electrically conductive material over the plurality of layers corresponding to the magnetoresistive element;

patterning the second layer of electrically conductive material to form an electrode;

patterning the plurality of layers corresponding to the magnetoresistive element to form the magnetoresistive element, the magnetoresistive element including a plurality of magnetic layers and a tunnel junction;

after forming the magnetoresistive element, etching the first layer of electrically conductive material; and forming a second via over the electrode.

14. The method of claim 13, wherein the electrically conductive material in the first via is copper.

15. The method of claim 13, wherein depositing the first layer of electrically conductive material over the first via and the layer of dielectric material results in a recess in the first layer of electrically conductive material overlying the first via, wherein the recess in the first layer of electrically conductive material is repeated in the plurality of layers corresponding to the magnetoresistive element as a recess in the plurality of layers corresponding to the magnetoresistive element, wherein the recess in the plurality of layers corresponding to the magnetoresistive element is repeated in the second layer of electrically conductive layer as a recess in the second layer of electrically conductive material, and wherein patterning the second layer of electrically conductive material and patterning the plurality of layers corresponding to the magnetoresistive element is based at least in part on the recess in the second layer of electrically conductive material.

16. The method of claim 15, wherein patterning the plurality of layers corresponding to the magnetoresistive element and patterning the second layer of electrically conductive material further comprises patterning the plurality of layers corresponding to the magnetoresistive element and patterning the second layer of electrically conductive material such that the magnetoresistive element and the electrode are offset from the first via, wherein the offset is determined based on the recess in the second layer of electrically conductive material.

17. The method of claim 13, wherein patterning the plurality of layers corresponding to the magnetoresistive element and patterning the second layer of electrically conductive material further comprises patterning the plurality of layers corresponding to the magnetoresistive element and patterning the second layer of electrically conductive material such that the magnetoresistive element and the electrode are offset from the first via.

18. The method of claim 13 wherein forming the second via over the electrode further includes offsetting, in at least one direction, the second via with respect to the magnetoresistive element.

19. The method of claim 13, wherein forming the magnetoresistive element further comprises forming a magnetic tunnel junction memory cell that includes a fixed magnetic layer and a free magnetic layer.

20. A method of forming a magnetoresistive based device, comprising:

filling a first via with an electrically conductive material, the first via formed in a layer of dielectric material;

sputtering to lower an upper surface of the electrically conductive material in the first via such that the upper surface of the electrically conductive material in the first via is below an upper surface of the layer of dielectric material within which the first via is formed;

depositing a first layer of electrically conductive material over the first via and the layer of dielectric material, wherein depositing the first layer of electrically conductive material results in a recess in the first layer of electrically conductive material overlying the first via, wherein a first portion of the first layer of electrically conductive material contacts the upper surface of the electrically conductive material in the first via, and wherein the first portion of the first layer of electrically conductive material is below the upper surface of the layer of dielectric material;

depositing a plurality of layers corresponding to a magnetic tunnel junction memory element;

depositing a second layer of electrically conductive material over the plurality of layers corresponding to the magnetoresistive element;

patterning the second layer of electrically conductive material to form an electrode;

patterning the plurality of layers corresponding to the magnetic tunnel junction memory element to form the magnetic tunnel junction memory element, the magnetic tunnel junction memory element including a fixed magnetic layer, a free magnetic layer, and a tunnel junction;

after forming the magnetic tunnel junction memory element, etching the first layer of electrically conductive material to form an etched first layer of electrically conductive material, wherein a portion of the etched first layer of electrically conductive material lies above the upper surface of the layer of dielectric material within which the first via is formed; and forming a second via over the electrode, wherein the second via is offset, in at least one direction, with respect to the magnetoresistive element.

* * * * *